(12) United States Patent
Ye et al.

(10) Patent No.: US 8,422,226 B2
(45) Date of Patent: Apr. 16, 2013

(54) HEAT DISSIPATION DEVICE

(75) Inventors: Zhen-Xing Ye, Shenzhen (CN);
Xian-Xiu Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 198 days.

(21) Appl. No.: 13/045,574

(22) Filed: Mar. 11, 2011

(65) Prior Publication Data
US 2012/0176747 A1 Jul. 12, 2012

(51) Int. Cl.
*H05K 7/20* (2006.01)

(52) U.S. Cl.
USPC .......................................... 361/695; 361/719

(58) Field of Classification Search .................... None
See application file for complete search history.

(56) References Cited

U.S. PATENT DOCUMENTS

| | | | | |
|---|---|---|---|---|
| 6,130,820 | A * | 10/2000 | Konstad et al. ............... | 361/695 |
| 6,775,139 | B2 * | 8/2004 | Hsueh .......................... | 361/697 |
| 7,580,259 | B2 * | 8/2009 | Hsiao ........................... | 361/695 |
| 2008/0024983 | A1 * | 1/2008 | Anderl et al. ................. | 361/695 |
| 2009/0277620 | A1 * | 11/2009 | Hsiao ........................... | 165/121 |
| 2009/0310295 | A1 * | 12/2009 | Chou et al. .............. | 361/679.48 |

\* cited by examiner

*Primary Examiner* — Gregory Thompson
(74) *Attorney, Agent, or Firm* — Altis Law Group, Inc.

(57) ABSTRACT

A heat dissipation device is used to dissipate heat generated by a number of memory chips of a motherboard. The heat dissipation device includes a bracket attached to the motherboard and at one side of the memory chips, at least one fan, and at least one connection member attached to the corresponding fan. The fan is adjustably attached to the bracket by the connection member.

6 Claims, 6 Drawing Sheets

HEAT DISSIPATION DEVICE

BACKGROUND

1. Technical Field

The present disclosure relates to heat dissipation devices, and especially relates to a heat dissipation device for memory chips.

2. Description of Related Art

With the continuing development of electronic technology, memory chips generate more heat during operation than previously. The heat needs to be dissipated as quickly as possible. In some cases, two metallic cooling fins are added to opposite sides of each memory to dissipate heat therefrom. However, this method makes use of convection only, which is inefficient in dissipating heat generated by the memory chips.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
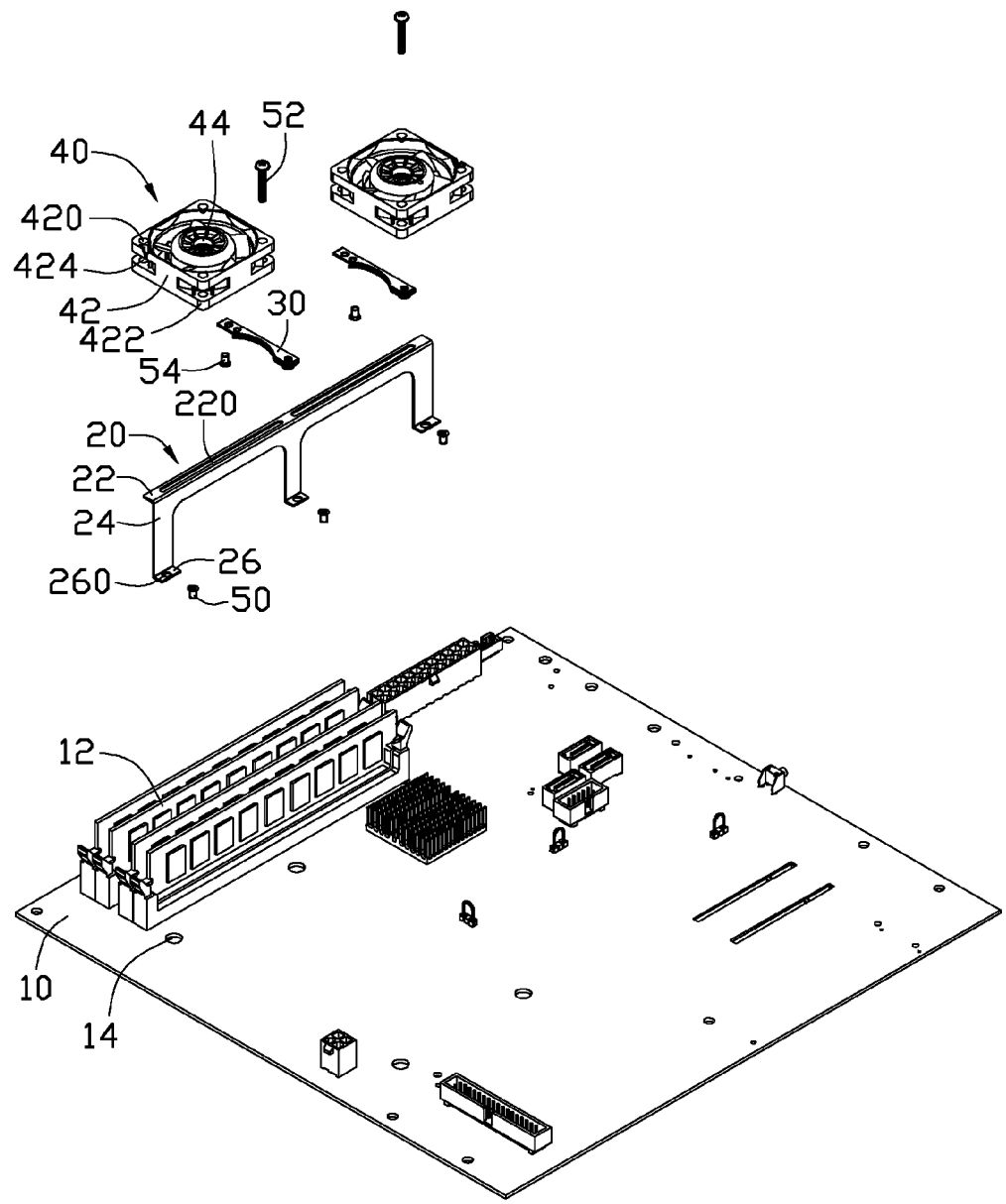
FIG. 1 is an exploded, isometric view of an exemplary embodiment of a heat dissipation device, together with a motherboard and a plurality of memory chips, the heat dissipation device includes a connection member.

Referring to FIG. 1, an exemplary embodiment of a heat dissipation device is used to dissipate heat generated by a plurality of memory chips 12 electrically connected to a motherboard 10. The heat dissipation device includes a bracket 20, two fans 40, two connection members 30, three first fasteners 50, two second fasteners 52, and two third fasteners 54.

The motherboard 10 defines three fastening holes 14 therein, at one side of the memory chips 12.

The bracket 20 is substantially E-shaped, and includes a top plate 22 and three spaced lateral plates 24 substantially extending down from a side of the top plate 22. The top plate 22 longitudinally defines two spaced slide slots 220, each located between two corresponding adjacent lateral plates 24. A mounting tab 26 substantially perpendicularly extends from a distal end of each lateral plate 24, opposite to and away from the top plate 22. Each mounting tab 26 defines a through hole 260.

Figure 2:
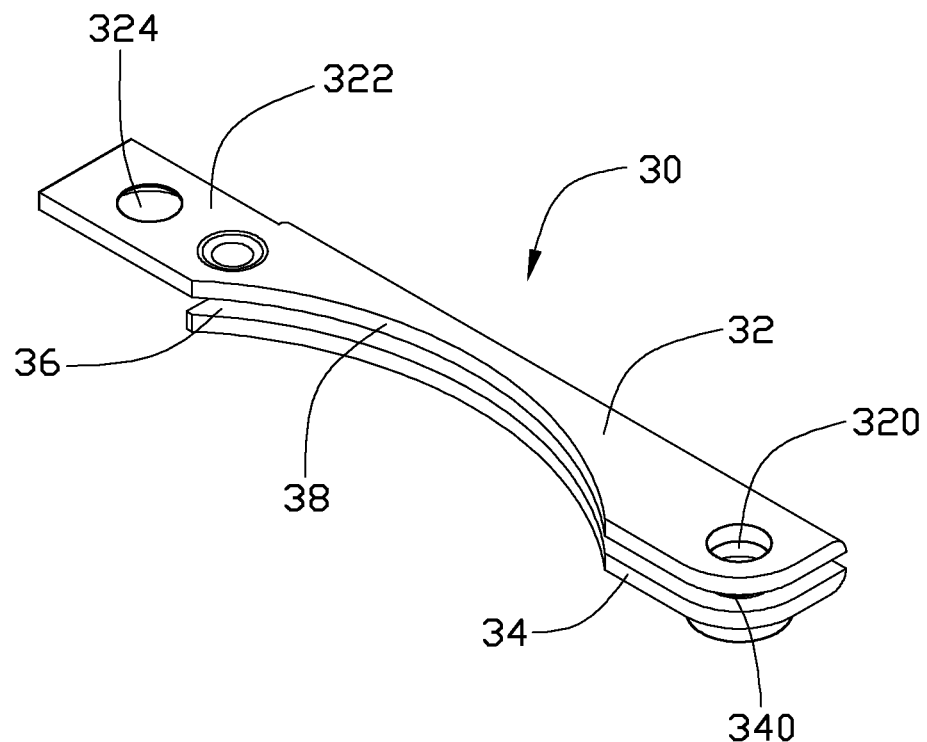
FIGS. 2 and 3 are enlarged views of the connection member of FIG. 1, but showing different perspectives.
Figure 3:
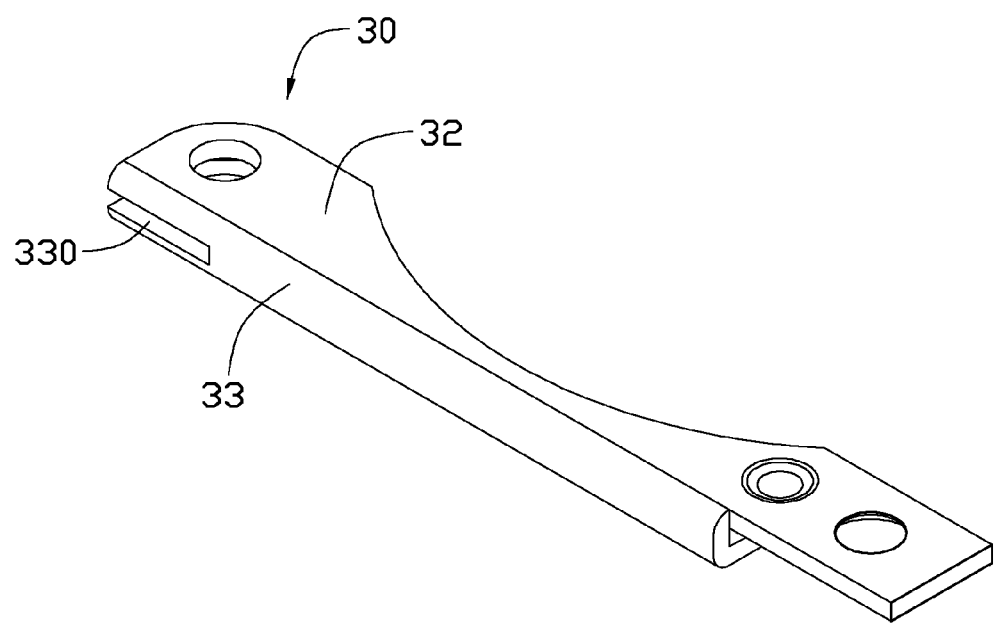

Referring to FIGS. 2 and 3, each connection member 30 includes a first clamping piece 32, a second clamping piece 34 substantially parallel to the first clamping piece 32, and a connection piece 33 substantially perpendicularly connected between corresponding sides of the first clamping piece 32 and the second clamping piece 34. A receiving space 36 is bounded by the first clamping piece 32, the connection piece 33, and the second clamping piece 34. A first end of the first clamping piece 32 defines a through hole 320, and a first end of the second clamping piece 34 corresponding to the first end of the first clamping piece 32 defines a mounting hole 340 aligning with the through hole 320. The first clamping piece 32 and second clamping piece 34 each define a substantially arc-shaped slot 38 in a side opposite to the connection piece 33. A tab 322 extends from a second end of the first clamping piece 32 opposite the first end. The tab 322 defines a through hole 324. The connection piece 33 defines an avoiding cutout 330 in one end opposite to the tab 322.

Referring to FIG. 1 again, each fan 40 includes a frame 42 and a plurality of vanes 44 received in the frame 42. The frame 42 includes an upper frame 420 and a lower frame 422 opposite to the upper frame 420. The upper frame 420 and the lower frame 422 each respectively define four through holes 424 in four corners thereof.

In this embodiment, the first fasteners 50, the second fasteners 52, and the third fasteners 54 are all screws.

Figure 4:
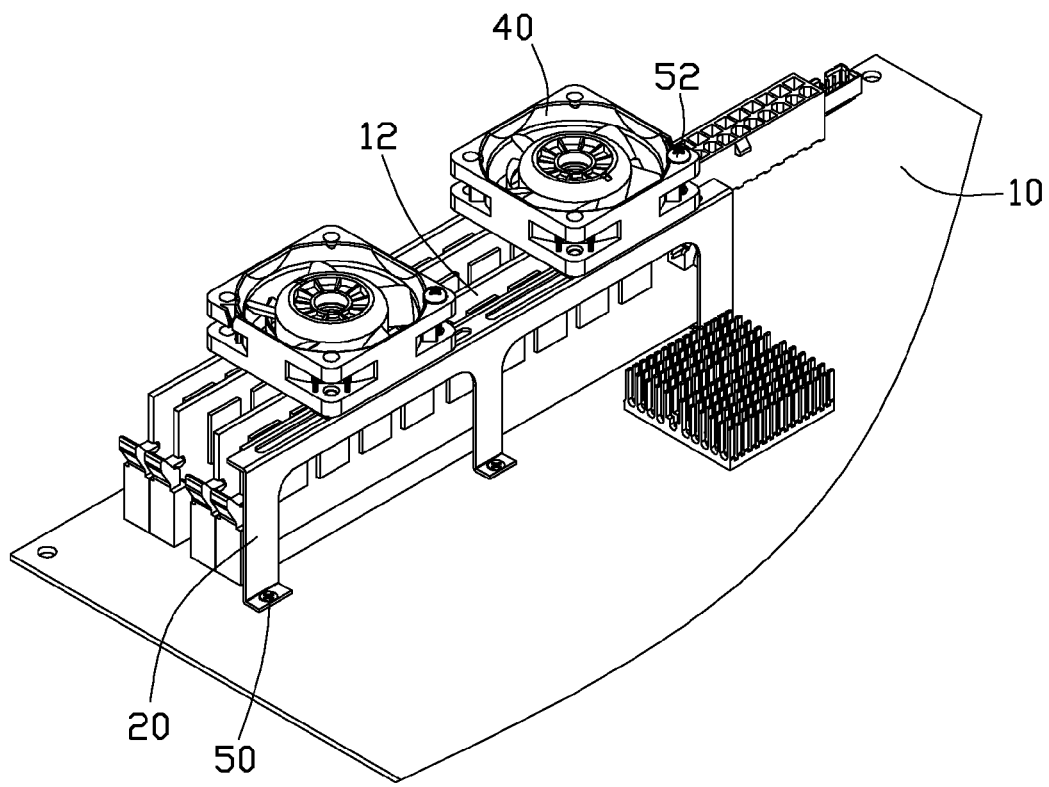
FIGS. 4 to 5 are assembled, isometric views of FIG. 1, but showing different states of use.

Referring to FIG. 4, in assembly, each fan 40 is supported on the first clamping piece 32 of a corresponding connection member 30, with the lower frame 422 of the fan 40 resisting against the first clamping piece 32 and the through hole 320 and 324 of the connection member 30 aligning with the through holes 424 at the same side of the fan 40. One third fastener 54 extends through the through hole 324 and engages in the corresponding through hole 424 to fasten the connection member 30 to the fan 40. The fans 40 with the connection members 30 are then arranged on the bracket 20. One side of the top plate 22 opposite to the lateral plates 24 extends through the avoiding cutouts 330 of the connection members 30, with each slide slot 220 of the bracket 20 aligning with the through hole 320 and the mounting hole 340 of the corresponding connection member 30. Each second fastener 52 extends through the corresponding though holes 424 of the upper frame 420 and the lower frame 422 of the fan 40, the corresponding slide slot 220 of the bracket 20, the corresponding through hole 320 of the connection member 30 in that order, and engages in the corresponding mounting hole 340 of the connection member 30 to fasten the corresponding fan 40 and connection member 30 to the bracket 20. The through holes 260 of the bracket 20 are aligned with the corresponding fastening holes 14 of the motherboard 10, with the top plate 22 of the bracket 20 and the fans 40 above the memory chips 12. The first fasteners 50 extend through the through holes 260 and engage in the fastening holes 14, to fasten the bracket 20 to the motherboard 10. Therefore, the fans 40 are mounted above the memory chips 12 to dissipate heat.

Figure 5:
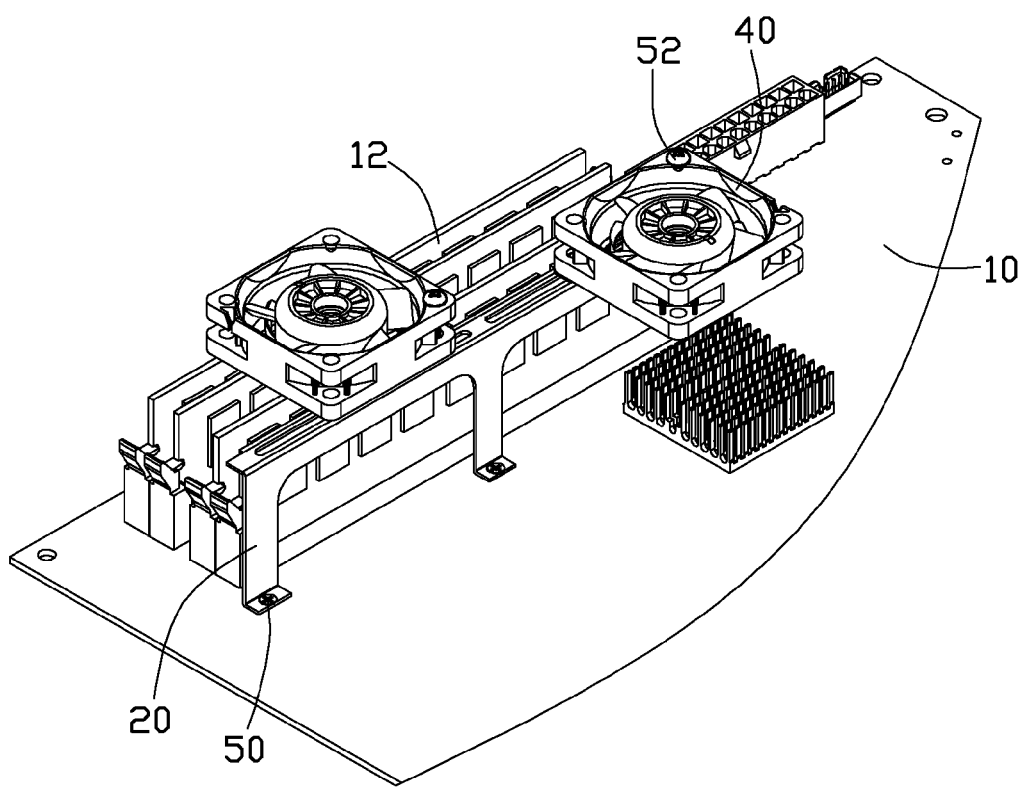
Figure 6:
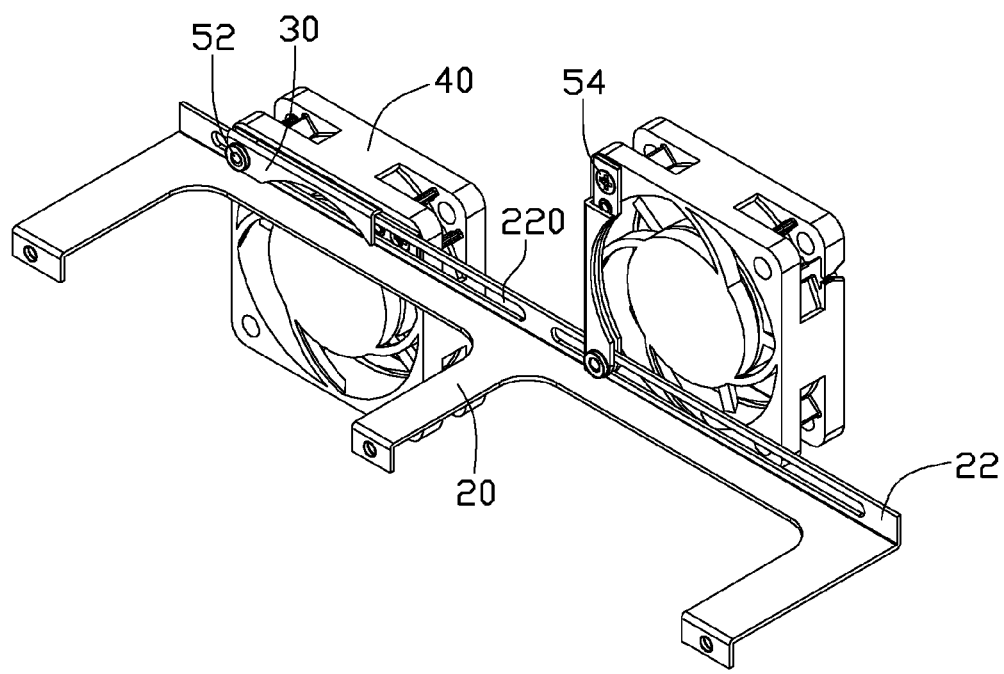
FIG. 6 is an assembled, isometric view of the heat dissipation device of FIG. 1, but viewed from another perspective.

Referring to FIGS. 5 and 6, in other embodiments, according to heat-dissipation need of the memory chips 12, the second fasteners 52 can be loosened, and the fans 40 can then be slid along the slide slot 220 to a needed position, and then the second fasteners 52 are retightened. When the motherboard 10 has another electronic element, such as a heat sink needing heat dissipation, one second fastener 52 is loosened, the corresponding fan 40 rotated about the loosened fastener 52, and the top plate 22 moved out of the avoiding slot 330 and received in the receiving space 36 of the corresponding connection member 30, so that the fan 40 is mounted above the another electronic element.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

The invention claimed is:

1. A heat dissipation device used to dissipate heat generated by a plurality of memory chips of a motherboard, the heat dissipation device comprising:
   a bracket attached to the motherboard and at one side of the plurality of memory chips;
   at least one fan; and
   at least one connection member mounting the at least one fan to the bracket, wherein the connection member is adjustable relative to the bracket;
   wherein the bracket comprises a top plate and three lateral plates substantially perpendicularly extending down from a first side of the top plate, wherein a mounting tab extends from a distal end of each lateral plate, opposite to and away from the top plate, to be fastened to the motherboard.

2. The heat dissipation device of claim 1, wherein the top plate longitudinally defines a long slide slot, the connection member comprises a first clamping piece, a second clamping piece substantially parallel to the first clamping piece, and a connection piece substantially perpendicularly connected between corresponding sides of the first clamping piece and the second clamping piece, a first fastener extends through the at least one fan, the first clamping piece, and the slide slot to engage with the second clamping piece, thereby adjustably fastening the at least one fan to the bracket.

3. The heat dissipation device of claim 2, wherein a first end of the first clamping piece defines a through hole through which the first fastener extends, a first end of the second clamping piece defines a mounting hole aligning with the through hole in which the first fastener engages.

4. The heat dissipation device of claim 3, wherein a tab extends from a second end of the first clamping piece opposite to the first end, the tab defines a through hole through which a second fastener extends to engage in the at least one fan to fasten the at least one fan and the connection member together.

5. The heat dissipation device of claim 4, wherein the connection piece defines an avoiding cutout in one end opposite to the tab, to clamp a second side of the top plate opposite to the first side.

6. The heat dissipation device of claim 5, wherein a receiving space communicating with the avoiding cutout is bounded by the first clamping piece, the connection piece, and the second clamping piece, the second side of the top plate is operable to be moved out of the avoiding cutout and received in the receiving space.

* * * * *